(12) United States Patent
Chang et al.

(10) Patent No.: US 10,804,371 B2
(45) Date of Patent: Oct. 13, 2020

(54) STRUCTURE AND FORMATION METHOD OF SEMICONDUCTOR DEVICE WITH GATE STACK

(71) Applicant: Taiwan Semiconductor Manufacturing Company, Ltd., Hsinchu (TW)

(72) Inventors: Che-Cheng Chang, New Taipei (TW); Sheng-Chi Shih, Toufen Township (TW); Yi-Jen Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 64 days.

(21) Appl. No.: 16/050,420

(22) Filed: Jul. 31, 2018

(65) Prior Publication Data
US 2018/0350949 A1 Dec. 6, 2018

Related U.S. Application Data

(62) Division of application No. 14/507,458, filed on Oct. 6, 2014, now Pat. No. 10,164,049.

(51) Int. Cl.
| H01L 21/3213 | (2006.01) |
| H01L 21/28 | (2006.01) |
| H01L 29/66 | (2006.01) |
| H01L 29/423 | (2006.01) |
| H01L 29/49 | (2006.01) |
| H01L 29/51 | (2006.01) |

(52) U.S. Cl.
CPC .. *H01L 29/66545* (2013.01); *H01L 21/28114* (2013.01); *H01L 21/28123* (2013.01); *H01L 21/32137* (2013.01); *H01L 29/42376* (2013.01); *H01L 29/4966* (2013.01); *H01L 29/517* (2013.01)

(58) Field of Classification Search
CPC .................................................. H01L 29/66545
See application file for complete search history.

(56) References Cited

U.S. PATENT DOCUMENTS

| 8,421,132 B2 | 4/2013 | Cai et al. |
| 9,012,319 B1 | 4/2015 | Choi et al. |

(Continued)

FOREIGN PATENT DOCUMENTS

| CN | 102194874 A | 9/2011 |
| CN | 102347227 A | 2/2012 |

(Continued)

*Primary Examiner* — William A Harriston
(74) *Attorney, Agent, or Firm* — Slater Matsil, LLP

(57) ABSTRACT

A structure and a formation method of a semiconductor device are provided. The semiconductor device includes a semiconductor substrate and a first gate electrode over the semiconductor substrate. The semiconductor device also includes a first gate dielectric layer between the first gate electrode and the semiconductor substrate. The semiconductor device further includes a second gate electrode over the semiconductor substrate. The second gate electrode has an upper portion and a lower portion between the upper portion and the semiconductor substrate, and the upper portion is wider than the lower portion. In addition, the semiconductor device includes a second gate dielectric layer between the second gate electrode and the semiconductor substrate.

20 Claims, 10 Drawing Sheets

(56) References Cited

U.S. PATENT DOCUMENTS

| | | |
|---|---|---|
| 2005/0035396 A1 | 2/2005 | Yaegashi |
| 2006/0063321 A1 | 3/2006 | Sasaki |
| 2006/0065934 A1 | 3/2006 | Okayama et al. |
| 2006/0214197 A1 | 9/2006 | Nakamura et al. |
| 2007/0145455 A1 | 6/2007 | Yasui et al. |
| 2008/0001230 A1 | 1/2008 | Lee et al. |
| 2011/0104880 A1 | 5/2011 | Heinrich et al. |
| 2012/0086056 A1* | 4/2012 | Beyer ............... H01L 21/31111 257/288 |
| 2013/0005128 A1 | 1/2013 | Ng et al. |
| 2013/0059435 A1 | 3/2013 | Yang et al. |
| 2013/0065368 A1 | 3/2013 | Yasui et al. |
| 2013/0149854 A1 | 6/2013 | Ishii et al. |
| 2014/0001559 A1* | 1/2014 | Lin ..................... H01L 29/6681 257/368 |
| 2014/0038376 A1 | 2/2014 | Zhu et al. |
| 2014/0191299 A1 | 7/2014 | Wang et al. |
| 2014/0239367 A1 | 8/2014 | Saito et al. |
| 2014/0264609 A1 | 9/2014 | Fung |
| 2014/0273377 A1 | 9/2014 | Kim |
| 2014/0363960 A1 | 12/2014 | Kim et al. |
| 2015/0115363 A1* | 4/2015 | Chang ................. H01L 27/1211 257/347 |
| 2017/0287909 A1* | 10/2017 | Oh ...................... H01L 27/0207 |
| 2018/0102418 A1* | 4/2018 | Bih ...................... H01L 29/513 |
| 2018/0350949 A1* | 12/2018 | Chang ............... H01L 21/28114 |

FOREIGN PATENT DOCUMENTS

| | | |
|---|---|---|
| CN | 103620748 A | 3/2014 |
| CN | 104051460 A | 9/2014 |
| KR | 1020000048262 A | 7/2000 |
| KR | 1020140002455 A | 1/2014 |
| KR | 1020140090919 A | 7/2014 |

\* cited by examiner

STRUCTURE AND FORMATION METHOD OF SEMICONDUCTOR DEVICE WITH GATE STACK

PRIORITY CLAIM AND CROSS-REFERENCE

This application is division of U.S. application Ser. No. 14/507,458, filed on Oct. 6, 2014, and entitled "Structure and Formation Method of Semiconductor Device with Gate Stack," which application is incorporated herein by reference.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs. However, these advances have increased the complexity of processing and manufacturing ICs.

Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
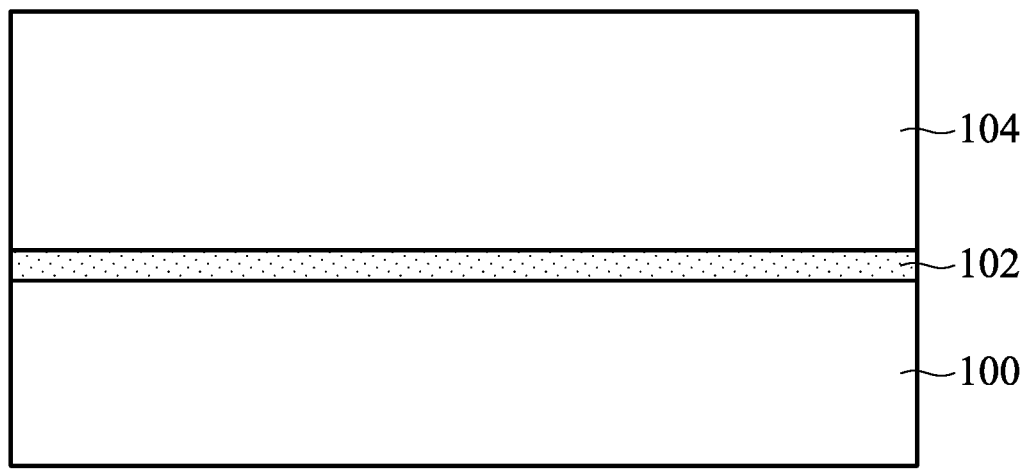
FIGS. 1A-1G are cross-sectional views of various stages of a process for forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1G are cross-sectional views of various stages of a process for forming a semiconductor device, in accordance with some embodiments. Additional operations can be provided before, during, and/or after the stages described in FIGS. 1A-1G, in accordance with some embodiments. Some of the stages described can be replaced or eliminated for different embodiments. Additional features can be added in the semiconductor device. Some of the features described below can be replaced or eliminated for different embodiments.

As shown in FIG. 1A, a semiconductor substrate 100 is provided. In some embodiments, the semiconductor substrate 100 is a bulk semiconductor substrate. The bulk semiconductor substrate may be a semiconductor wafer such as a silicon wafer. In some embodiments, the semiconductor substrate 100 includes an elementary semiconductor material such as silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof.

In some embodiments, the semiconductor substrate 100 is a semiconductor-on-insulator (SOI) substrate. The SOI substrate may be fabricated by using a separation by implantation of oxygen (SIMOX) process, a wafer bonding process, another applicable method, or a combination thereof.

In some embodiments, the semiconductor substrate 100 includes various doped regions (not shown) depending on design requirements of the semiconductor device. The doped regions include, for example, p-type wells and/or n-type wells. In some embodiments, the doped regions are doped with p-type dopants. For example, the doped regions are doped with boron or $BF_2$. In some embodiments, the doped regions are doped with n-type dopants. For example, the doped regions are doped with phosphor or arsenic. In some embodiments, some of the doped regions are p-type doped, and the other doped regions are n-type doped.

In some embodiments, one or more isolation features (not shown) are formed in the semiconductor substrate 100 to define and isolate various device elements (not shown) formed in the semiconductor substrate 100. The isolation features include, for example, trench isolation (STI) features, local oxidation of silicon (LOCOS) features, another suitable isolation feature, or a combination thereof.

Examples of the various device elements that may be formed in the semiconductor substrate 100 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, another applicable process, or a combination thereof.

As shown in FIG. 1A, a gate dielectric layer 102 is deposited over the semiconductor substrate 100, in accordance with some embodiments. In some embodiments, the gate dielectric layer 102 is made of silicon oxide, silicon nitride, silicon oxynitride, a dielectric material with high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

In some embodiments, the gate dielectric layer 102 is a dummy gate dielectric layer which will be replaced with another dielectric material. The dummy gate dielectric layer is, for example, a silicon oxide layer. In some embodiments, the gate dielectric layer 102 is deposited using a chemical vapor deposition (CVD) process, an atomic layer deposition (ALD) process, a thermal oxidation process, another applicable process, or a combination thereof.

As shown in FIG. 1A, a gate electrode layer 104 is deposited over the gate dielectric layer 102, in accordance with some embodiments. In some embodiments, the gate electrode layer 104 includes polysilicon, a metal material, another suitable conductive material, or a combination thereof. In some embodiments, the gate electrode layer 104 is a dummy gate electrode layer and will be replaced with another conductive material such as a metal material. The dummy gate electrode layer is made of, for example, polysilicon. In some embodiments, the gate electrode layer 104 is deposited using a chemical vapor deposition (CVD) process, an atomic layer deposition (ALD) process, another applicable process, or a combination thereof.

Many variations and modifications can be made to embodiments of the disclosure. In some embodiments, the gate electrode layer 104 is a dummy gate electrode layer, and the gate dielectric layer 102 is not formed. In some other embodiments, the gate electrode layer 104 and the gate dielectric layer 102 are formed over semiconductor fins (not shown) formed over the semiconductor substrate 100. The gate electrode layer 104 and the gate dielectric layer 102 are used to form gate stacks of a FinFET device.

In some embodiments, the gate electrode layer 104 and the gate dielectric layer 102 are patterned into multiple gate lines. The gate lines may be substantially parallel to each other. Photolithography and etching processes may be used to form the gate lines. Afterwards, each of the gate lines is further patterned into multiple gate stacks, in accordance with some embodiments. However, it should be appreciated that embodiments of the disclosure are not limited thereto. In some other embodiments, the gate electrode layer 104 and the gate dielectric layer 102 are patterned to form the gate stacks without forming the gate lines in advance.

Figure 1B:
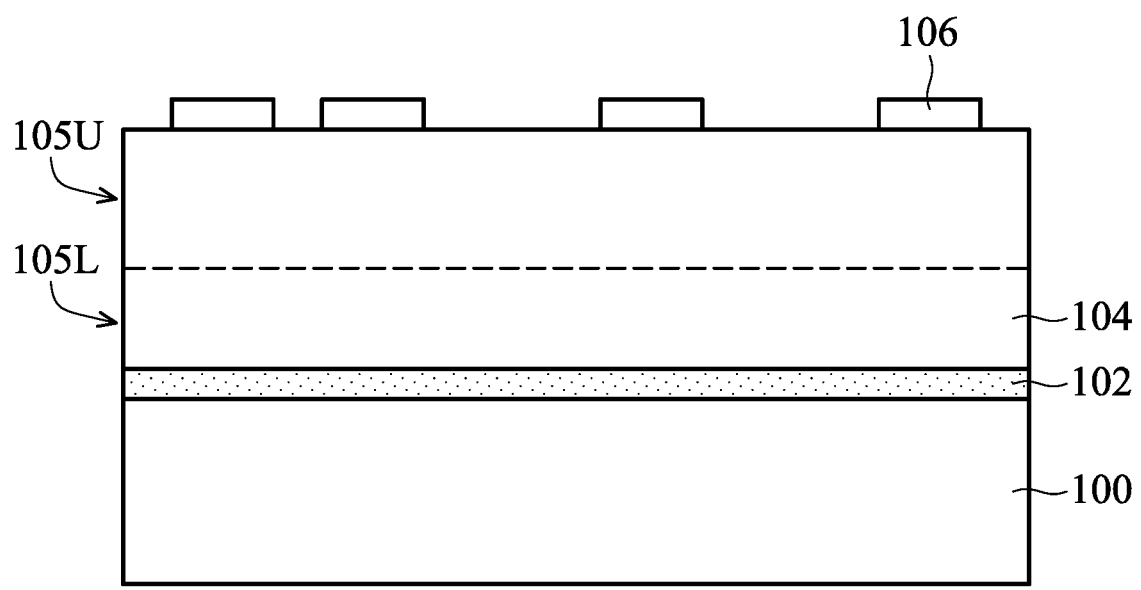

As shown in FIG. 1B, a hard mask 106 is formed over the gate electrode layer 104 to assist in the subsequent patterning process for forming gate stacks, in accordance with some embodiments. In some embodiments, the hard mask 106 is made of silicon oxide, silicon nitride, silicon oxynitride, silicon carbide, another suitable material, or a combination thereof. In some embodiments, the hard mask 106 has a multi-layer structure. In some embodiments, one or more patterned photoresist layers (not shown) are formed over a hard mask layer. Afterwards, one or more etching processes are performed to transfer the pattern of the photoresist layers to the hard mask layer, resulting in the formation the hard mask 106.

In some embodiments, an etching process including multiple etching operations are used to pattern the gate electrode layer 104 and the gate dielectric layer 102 to form multiple gate stacks. For example, an etching operation is performed to partially remove an upper portion 105U of the gate electrode layer 104. Afterwards, another etching operation is performed to partially remove a lower portion 105L of the gate electrode layer 104.

Figure 1C:
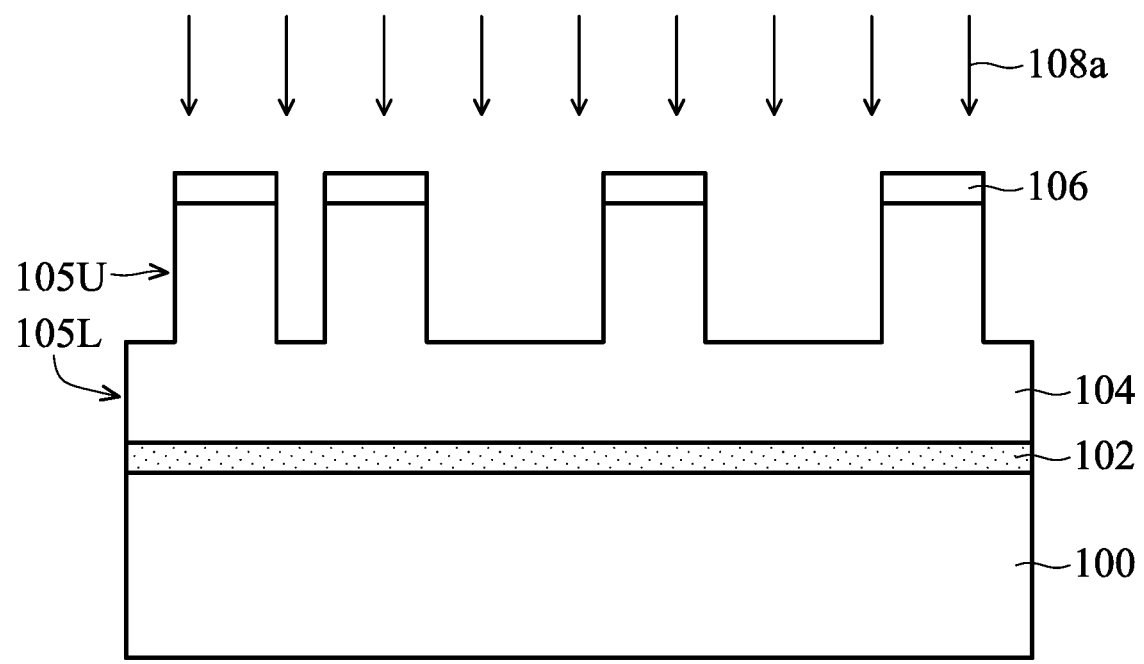

As shown in FIG. 1C, the upper portion 105U of the gate electrode layer 104 is partially removed by a first etching operation 108a, in accordance with some embodiments. In some embodiments, portions of the upper portion 105U not covered by the hard mask 106 are removed. The first etching operation 108a may be performed in a process chamber. In some embodiments, the reaction gas and/or liquid used in the first etching operation includes $Cl_2$, $SF_6$, $N_2$, $CF_4$, $CHF_3$, $CH_2F_2$, $N_2H_2$, $O_2$, He, another suitable compound, or a combination thereof. The pressure of the process chamber may be maintained in a range from about 1 mTorr to about 40 mTorr. The temperature of the first etching operation 108a may be maintained at a temperature in a range from about 10 degrees C. to about 50 degrees C. The power of bias used in the first etching operation 108a may be in a range from about 100 W to about 1000 W.

Figure 1D:
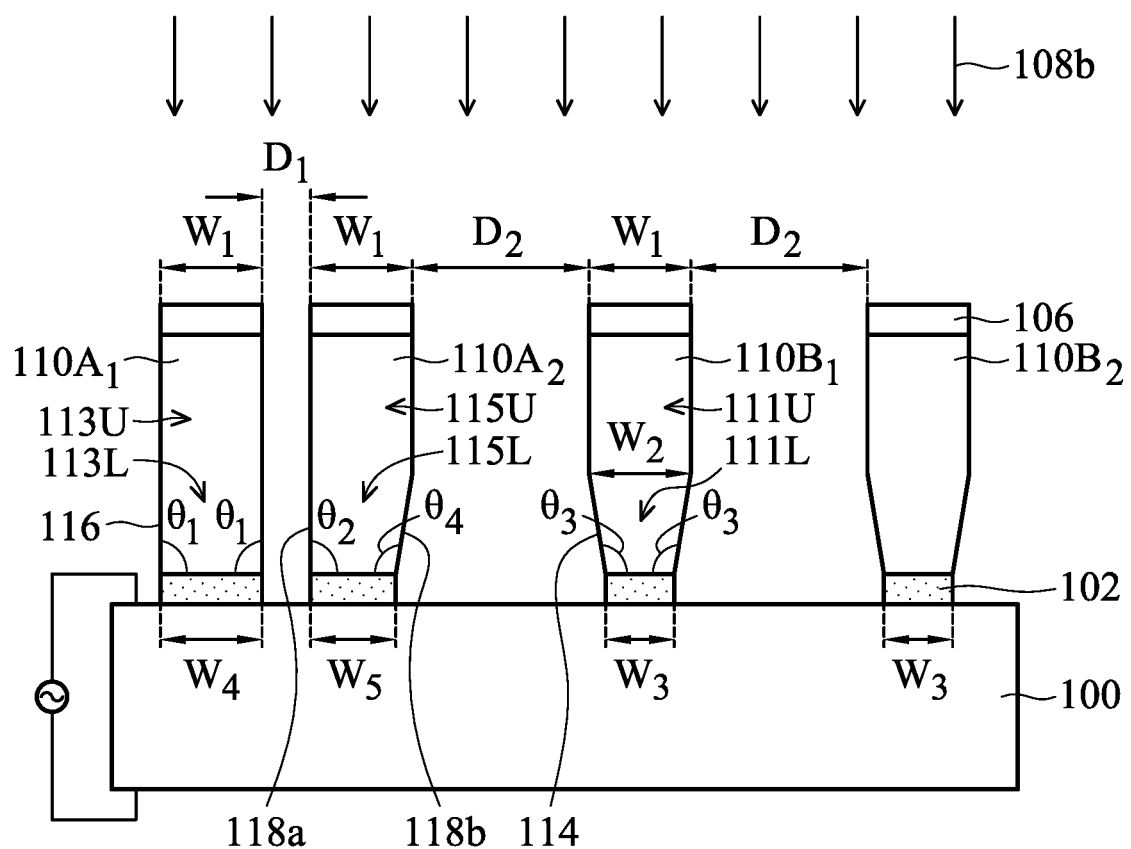

As shown in FIG. 1D, the lower portion 105L of the gate electrode layer 104 is partially removed by a second etching operation 108b, in accordance with some embodiments. In some embodiments, the gate dielectric layer 102 is also patterned. Another etching operation may then be performed to pattern the gate dielectric layer 102. As a result, multiple gate stacks including gate electrodes $110A_1$, $110A_2$, $110B_1$, and $110B_2$ and the gate dielectric layer 102 are formed. In some embodiments, the gate electrodes $110A_1$ and $110A_2$ are formed in a region of the semiconductor substrate 100 where the density of gate electrodes is relatively high. The gate electrodes $110B_1$ and $110B_2$ are formed in another region of the semiconductor substrate 100 where the density of the gate electrodes is relatively low.

As shown in FIG. 1D, the gate electrode $110A_2$ is separated from the gate electrode $110A_1$ by a distance $D_1$. In some embodiments, the distance $D_1$ is in a range from about 5 nm to about 100 nm. As shown in FIG. 1D, the gate electrode 110A2 is separated from the gate electrode 110B1 by a distance D2. In some embodiments, the gate electrode 110B1 is also separated from the gate electrode 110B2 by a distance that is substantially equal to the distance D2. The distance between the gate electrodes 110B1 and 110B2 is also denoted as D2. In some embodiments, the distance D2 is greater than the distance D1. The distance D2 may be in a range from about 150 nm to about 5000 nm.

In some embodiments, the second etching operation 108b and the first etching operation 108a are performed in the same process chamber. The process chamber may be vacuumed to remove the reaction gas and/or liquid used in the first etching operation 108a before the second etching operation 108b is performed.

In some embodiments, the reaction gas and/or liquid used in the second etching operation 108b includes Cl2, BCl3, N2, CF4, CHF3, CH2F2, N2H2, O2, another suitable compound, or a combination thereof. The pressure of the process chamber may be maintained in a range from about 1 mTorr to about 10 mTorr. The temperature of the second etching operation 108*b* may be maintained at a temperature ranging from about 10 degrees C. to about 50 degrees C. The power of bias used in the second etching operation 108*b* may be in a range from about 100 W to about 1000 W.

In some embodiments, a voltage is applied to the semiconductor substrate 100 during the second etching operation 108*b*, as shown in FIG. 1D. Therefore, the etchant used in the second etching operation 108*b* may be attracted or controlled to mainly etch the lower portion 105L of the gate electrode layer 104. The upper portion 105U of the gate electrode layer 104 may substantially maintain the profile which has been formed in the first etching operation 108*a*.

In some embodiments, the voltage applied to the semiconductor substrate 100 is an alternating current voltage. In some other embodiments, the voltage applied to the semiconductor substrate 100 is a direct current voltage. In some embodiments, the voltage is applied to the semiconductor substrate 100 intermittently. In some embodiments, the application of the voltage is temporarily stopped to allow a protection layer (not shown) to be formed over sidewalls of the upper portions of the gate electrodes. In some embodiments, some reaction gas and/or liquid used in the second etching operation 108*b* may cause the formation of the protection layer. Because the application of the voltage is temporarily stopped, there is sufficient time for the etchant to distribute around the gate electrodes more evenly. The etching rate difference between different gate electrodes is lowered. Afterwards, the voltage is applied again to further remove the lower portions of the gate electrodes. During the removal of the lower portions of the gate electrodes, the protection layer may protect the upper portions of the gate electrodes to maintain the gate profiles.

In some embodiments, because the upper portions of the gate electrodes are protected, it is easier to control the etching operation to ensure the gate electrode layer 104 between adjacent gate electrodes are completely removed. As shown in FIG. 1D, the lower portions of some of the gate electrodes such as the gate electrodes 110A2, 110B1, and 110B2 are recessed, in accordance with some embodiments. Therefore, short circuiting is significantly prevented from between the adjacent gate electrodes. Residue is also prevented from being formed between the adjacent gate electrodes. The quality and reliability of the semiconductor device are improved.

In the second etching operation 108*b*, various process parameters may be adjusted to control the profiles of the gate electrodes. In some embodiments, various etchants are used in combination in the second etching operation 108*b*. For example, $Cl_2$ is used as a first etchant, and $CHF_3$ and/or $CH_2F_2$ are/is used as a second etchant. In some embodiments, by tuning the ratio of the amount of the first etchant to the second etchant, the profiles of the gate electrodes are controlled. For example, by raising the component of the first etchant, the lateral etching rate may be increased. As a result, the bottom portion of the gate electrodes may be more recessed. Other process parameters such as the applied voltage may also be adjusted to control the profile of the gate electrodes.

As shown in FIG. 1D, the gate electrode $110B_1$ has an upper portion 111U and a lower portion 111L. In some embodiments, the upper portion 111U is wider than the lower portion 111L. As shown in FIG. 1D, the gate electrode $110B_1$ has a width $W_1$ near the top of the gate electrode $110B_1$. The gate electrode $110B_1$ also has a width $W_3$ near the bottom of the gate electrode $110B_1$. The gate electrode $110B_1$ further has a portion having a width $W_2$ between the upper portion 111U and the lower portion 111L. In some embodiments, the width $W_1$ is greater than the width $W_3$. The width $W_2$ is greater than the width $W_3$.

In some embodiments, the lower portion 111L of the gate electrode $110B_1$ has a sidewall 114, which is a slanted sidewall. In some embodiments, the lower portion 111L of the gate electrode $110B_1$ gradually shrinks along a direction towards the semiconductor substrate 100, as shown in FIG. 1D. As shown in FIG. 1D, an angle $\theta_3$ is between the sidewall 114 of the lower portion 111L and the bottom of the gate electrode 110B1. In some embodiments, the angle $\theta_3$ is in a range from about 90 degrees to about 130 degrees.

As shown in FIG. 1D, the gate electrode $110A_1$ has an upper portion 113U and a lower portion 113L. In some embodiments, the upper portion 113U is substantially as wide as the lower portion 113L. The lower portion 113L has a width $W_4$ near the bottom of the gate electrode $110A_1$. In some embodiments, the width $W_4$ is substantially equal to the width $W_1$. In some embodiments, the width $W_4$ of the lower portion 113L of the gate electrode $110A_1$ is greater than the width $W_3$ of the lower portion 111L of the gate electrode $110B_1$.

As shown in FIG. 1D, the lower portion 113L has a sidewall 116. An angle $\theta_1$ is between the sidewall 116 of the bottom of the gate electrode $110A_1$. In some embodiments, the angle $\theta_3$ between the sidewall 114 and the bottom of the gate electrode $110B_1$ is greater than the angle $\theta_1$ between the sidewall 116 and the bottom of the gate electrode $110A_1$. Since the distance $D_2$ is greater than the distance $D_1$, the etchant used in the etching process for forming the gate electrodes may reach and etch the bottom portion of the gate electrode $110B_1$ more easily. As a result, the bottom portion 111L of the gate electrode $110B_1$ is more deeply recessed when compared with that of the gate electrode 110A1. In some embodiments, the angle θ1 is in a range from about 90 degrees to about 125 degrees. In some embodiments, the sidewall 116 of the gate electrode 110A1 is a substantially vertical sidewall. In these cases, the angle $\theta_1$ is substantially equal to about 90 degrees.

In some embodiments, each of the gate electrodes $110A_1$, $110B_1$, and $110B_2$ has symmetric sidewalls. In some embodiments, the gate electrode $110B_1$ has two symmetric sidewalls 114 which are slanted. The angles between the bottom of the gate electrode $110B_1$ and the opposite sidewalls 114 are substantially the same. Similarly, the gate electrode $110A_1$ has two symmetric sidewalls 116 which are substantially vertical sidewalls.

However, embodiments of the disclosure are not limited thereto. In some embodiments, the gate electrode has asymmetric sidewalls. As shown in FIG. 1D, the gate electrode $110A_2$ has an upper portion 115U and a lower portion 115L. The lower portion 115L has a first sidewall 118*a* and a second sidewall 118*b*. The first sidewall 118*a* is between the second sidewall 118*b* and the gate electrode $110A_1$. In some embodiments, the first sidewall 118*a* and the second sidewall 118*b* are asymmetric sidewalls, as shown in FIG. 1D. As shown in FIG. 1D, the lower portion 115L has a width $W_5$ near the bottom of the gate electrode $110A_2$. In some embodiments, the width $W_5$ is greater than the width $W_3$ of the gate electrode $110B_1$ and smaller than the width $W_4$ of the gate electrode $110A_1$.

As shown in FIG. 1D, an angle $\theta_2$ is between the first sidewall 118*a* and the bottom of the gate electrode $110A_2$, and an angle $\theta_4$ is between the second sidewall 118*b* and the bottom of the gate electrode $110A_2$. In some embodiments, the angle $\theta_4$ is greater than the angle $\theta_2$, as shown in FIG. 1D. In some embodiments, the angle $\theta_2$ is substantially equal to the angle $\theta_1$ of the gate electrode $110A_1$. In some embodiments, the angle $\theta_4$ is substantially equal to the angle $\theta_3$ of the gate electrode $110B_1$.

Figure 1E:
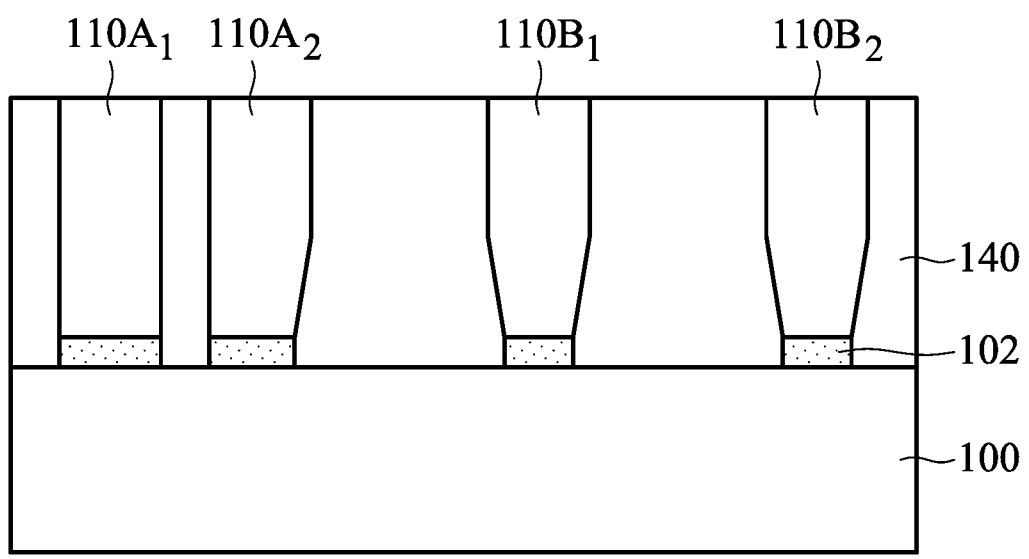

In some embodiments, the gate electrodes and the gate dielectric layer 102 are dummy gate electrodes and a dummy gate dielectric layer and will be replaced in subsequent processes. As shown in FIG. 1E, a dielectric layer 140 is deposited over the semiconductor substrate 100 to surround the gate electrodes $110A_1$, $110A_2$, $110B_1$, and $110B_2$, in accordance with some embodiments. The dielectric layer 140 may be made of silicon oxide, silicon oxynitride, borosilicate glass (BSG), phosphoric silicate glass (PSG), borophosphosilicate glass (BPSG), fluorinated silicate glass (FSG), a low-k material, a porous dielectric material, another suitable dielectric material, or a combination thereof. In some embodiments, the dielectric layer 140 is deposited using a CVD process, a spin-on process, another applicable process, or a combination thereof.

In some embodiments, spacers (not shown) are formed over sidewalls of the gate electrodes before the formation of the dielectric layer 140. The spacers may be used to protect the gate electrodes and assist in the formation of source/drain features (not shown).

In some embodiments, the dielectric layer 140 originally covers the gate electrodes and the hard mask 106 over the gate electrodes. Afterwards, a planarization process is performed on the dielectric layer 140 to thin down the dielectric layer 140 until the gate electrodes $110A_1$, $110A_2$, $110B_1$, and $110B_2$ are exposed. The hard mask 106 may also be removed during the planarization process. The planarization process may include a chemical mechanical polishing (CMP) process, a grinding process, an etching process, another applicable process, or a combination thereof.

Figure 1F:
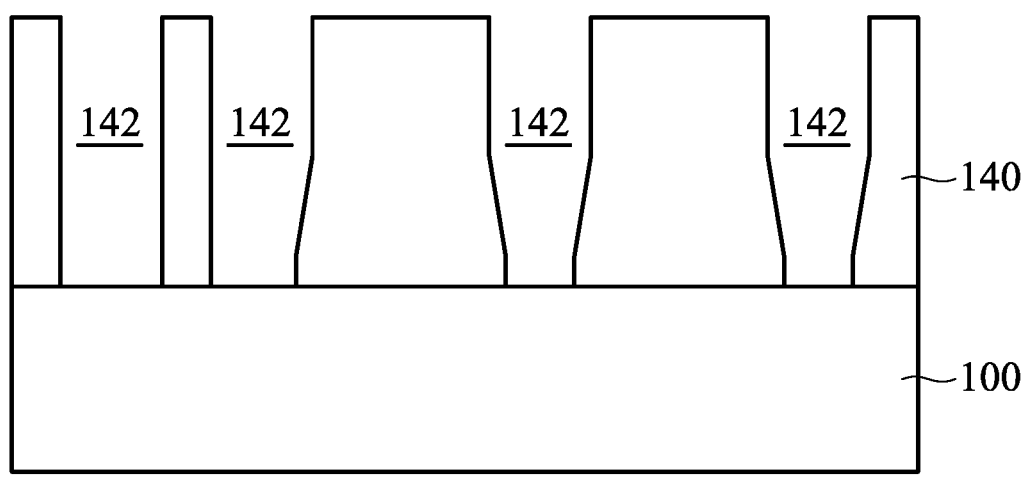

As shown in FIG. 1F, the gate electrodes $110A_1$, $110A_2$, $110B_1$, and $110B_2$ and the gate dielectric layer 102 are removed to form recesses 142 in the dielectric layer 140, in accordance with some embodiments. In some embodiments, the gate electrodes $110A_1$, $110A_2$, $110B_1$, and $110B_2$ and the gate dielectric layer 102 are removed using an etching process. In some other embodiments, the gate dielectric layer 102 is not removed.

Figure 1G:
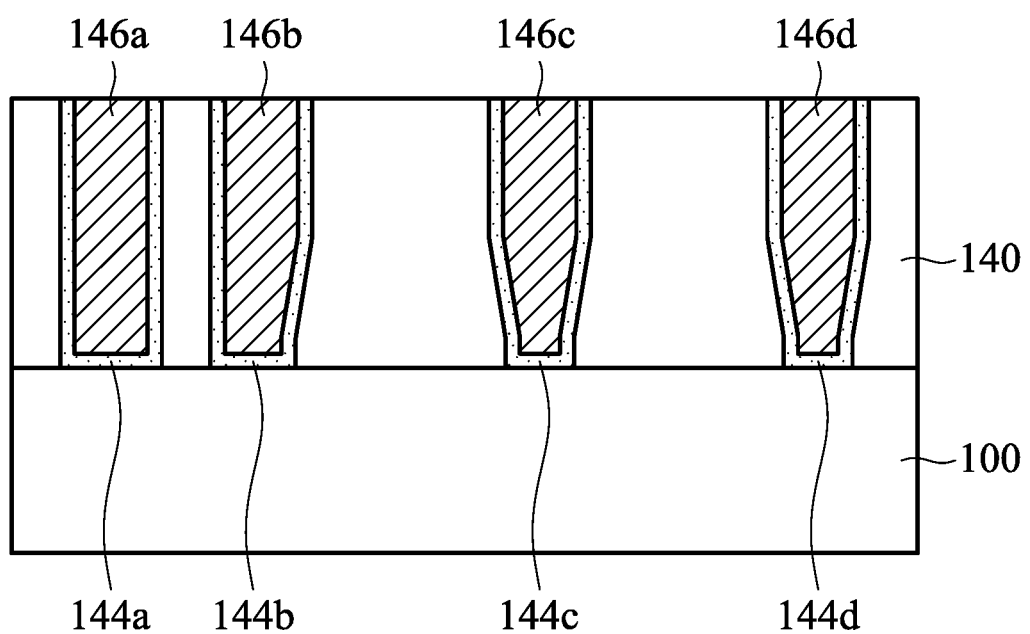

As shown in FIG. 1G, gate dielectric layers 144a, 144b, 144c, and 144d are formed in the recesses 142 to replace the gate dielectric layer 102, in accordance with some embodiments. In some embodiments, the gate dielectric layers 144a, 144b, 144c, and 144d are patterned from the same dielectric layer, and are thus made of the same material. In some other embodiments, some of the gate dielectric layers 144a, 144b, 144c, and 144d are made of different materials. In some embodiments, the gate dielectric layers 144a, 144b, 144c, and 144d are made of a dielectric material with high dielectric constant (high-K). Examples of the high-K dielectric material include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

As shown in FIG. 1G, metal gate electrodes 146a, 146b, 146c, and 146d are formed in the recesses 142 to respectively replace the gate electrodes $110A_1$, $110A_2$, $110B_1$, and $110B_2$, in accordance with some embodiments. The profiles of the metal gate electrodes 146a, 146b, 146c, and 146d are substantially the same as those of the gate electrodes $110A_1$, $110A_2$, $110B_1$, and $110B_2$, respectively. In some embodiments, each of the metal gate electrodes 146a, 146b, 146c, and 146d includes multiple metal layers. Each of the metal gate electrodes 146a, 146b, 146c, and 146d may include one or more work function layers (not shown), one or more barrier layers (not shown), and one or more metal filling layers.

The work function layer is used to provide desired work function for transistors to enhance device performance. In the embodiments of forming an NMOS transistor, the work function layer can be an n-type metal layer capable of providing a work function value suitable for the device, such as equal to or less than about 4.5 eV. The n-type metal layer may include metal, metal carbide, metal nitride, or a combination thereof. For example, the n-type metal layer includes titanium nitride, tantalum, tantalum nitride, other suitable materials, or a combination thereof.

On the other hand, in the embodiments of forming a PMOS transistor, the work function layer can be a p-type metal layer capable of providing a work function value suitable for the device, such as equal to or greater than about 4.8 eV. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be tuned to adjust the work function level. For example, a titanium nitride layer may be used as a p-type metal layer or an n-type metal layer, depending on the thickness and/or the compositions of the titanium nitride layer.

In some embodiments, one or more gate dielectric layers and one or more metal layers for forming the metal gate electrodes are deposited over the dielectric layer 140 and sidewalls and bottoms of the recesses 142. These layers may be sequentially deposited using suitable deposition processes. The deposition processes may include a CVD process, an ALD process, an electroplating process, an electroless plating process, a spin-on process, another applicable process, or a combination thereof.

As shown in FIG. 1F, the sidewalls of the lower portions the recesses 142 are slanted or vertical. The profiles of the recesses 142 may allow the deposition of the gate dielectric layers and metal layers to be performed more easily. Afterwards, a planarization process is performed to remove the gate dielectric layers and the metal layers outside of the recesses 142, resulting in the formation of the metal gate stacks, as shown in FIG. 1G.

Many variations and modifications can be made to embodiments of the disclosure. For example, the condition of the etching process for forming the gate electrodes may be tuned to control the profile of the gate electrodes. Therefore, the profiles of the gate electrodes $110A_1$, $110A_2$, $110B_1$, and $110B_2$ and the corresponding metal gate electrodes 146a, 146b, 146c, and 146d have many variations.

Figure 2A:
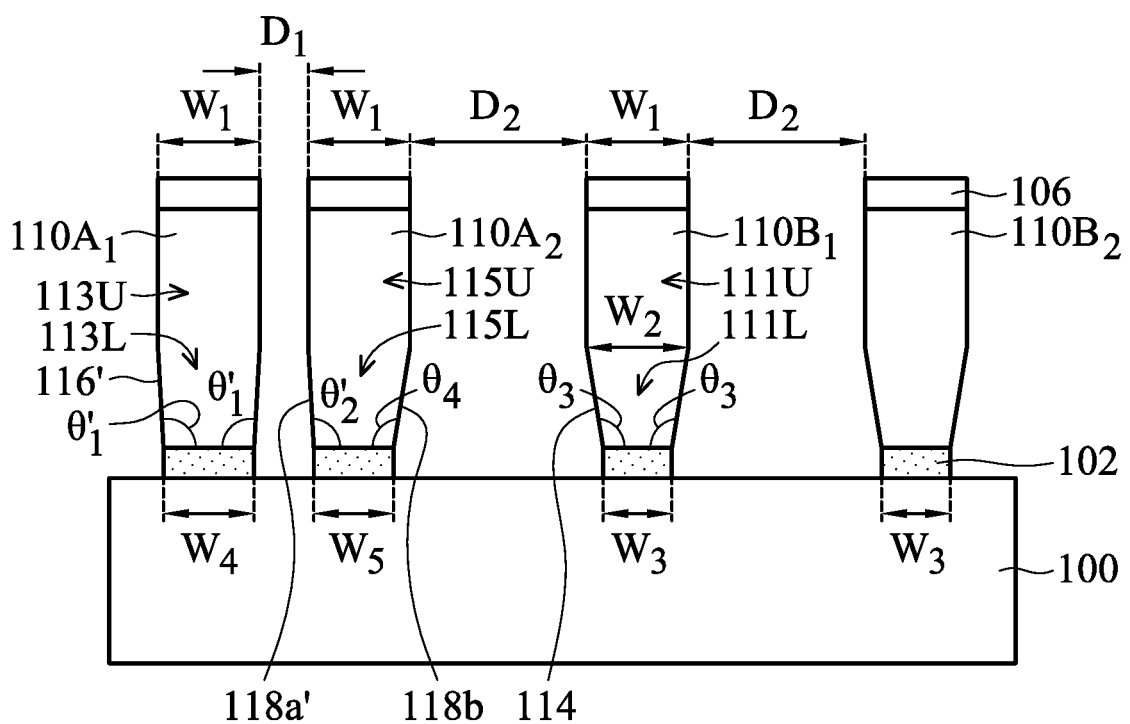
FIG. 2A is a cross-sectional view of a semiconductor device, in accordance with some embodiments.
Figure 2B:
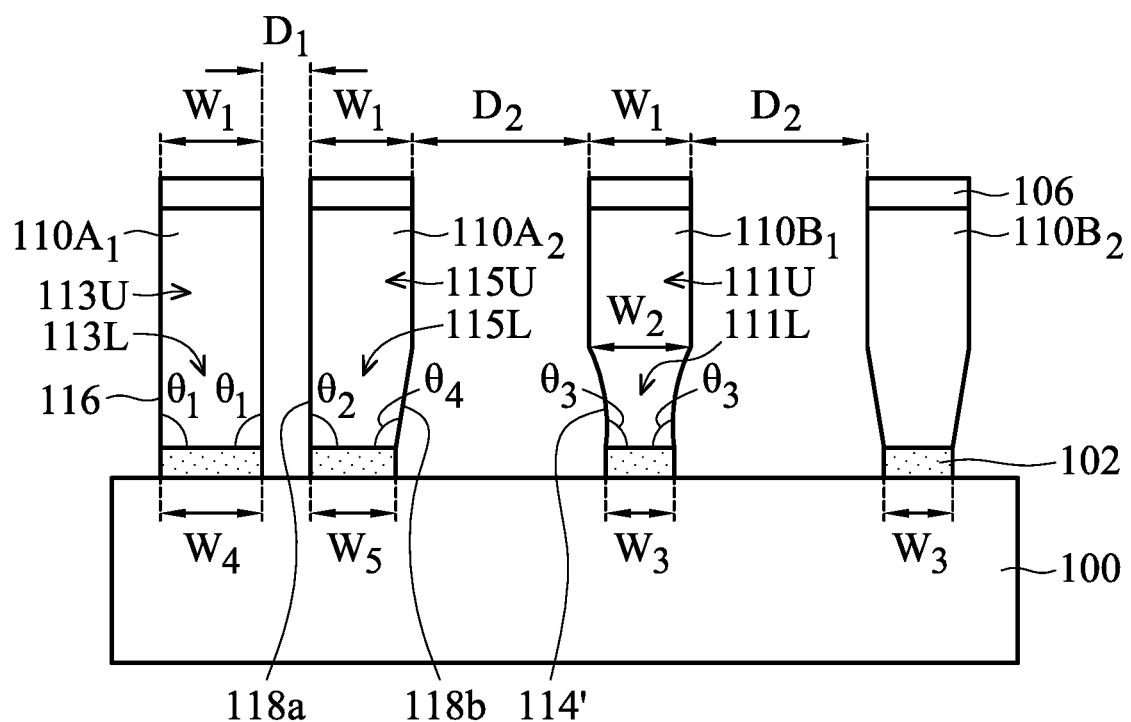
FIG. 2B is a cross-sectional view of a semiconductor device, in accordance with some embodiments.
Figure 2C:
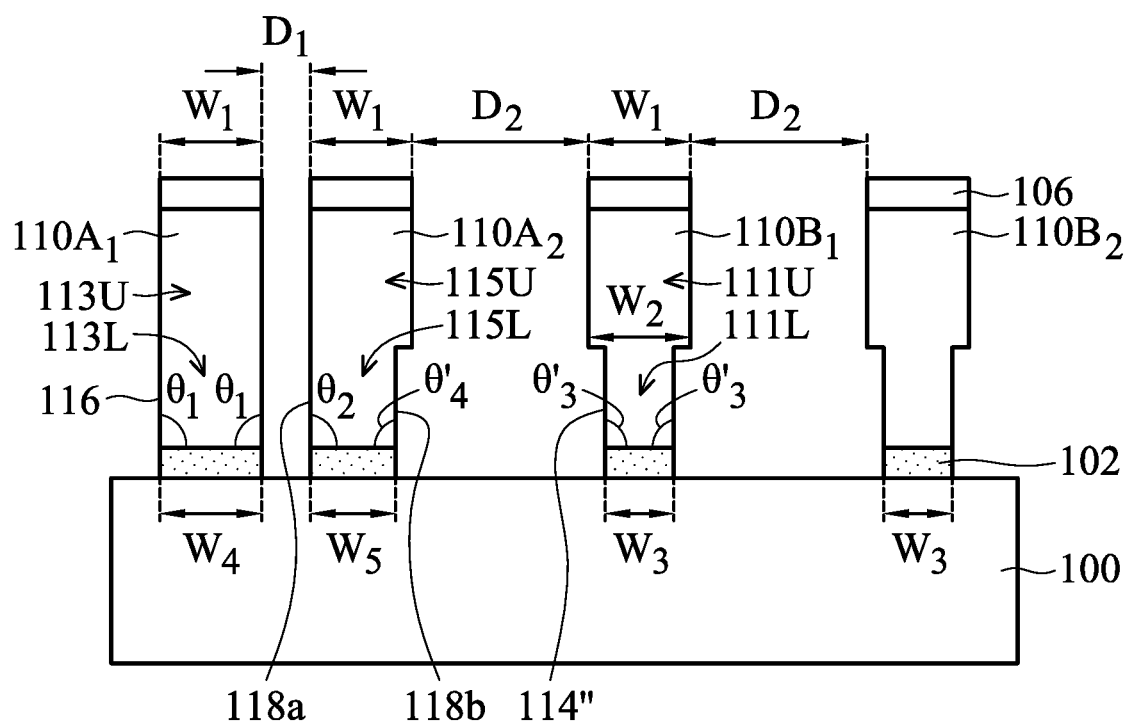
FIG. 2C is a cross-sectional view of a semiconductor device, in accordance with some embodiments.

FIGS. 2A-2C are cross-sectional views of a semiconductor device, in accordance with some embodiments. As shown in FIG. 2A, the lower portion 113L of the gate electrode $110A_1$ has a sidewall 116' which is slanted. The angle $\theta_1'$ between the sidewall 116' and the bottom of the gate electrode $110A_1$ is greater than 90 degrees. For example, the angle $\theta_1'$ is in a range from about 95 degrees to about 125 degrees. In some embodiments, the width $W_4$ near the bottom of the gate electrode $110A_1$ is smaller than the width $W_1$ near the top of the gate electrode $110A_1$, as shown in FIG. 2A. In other words, the upper portion 113U is wider than the lower portion 113L in some embodiments.

As shown in FIG. 2A, the gate electrode 110A$_2$ has a sidewall 118a' which is slanted. An angle θ$_2$' is between the sidewall 118a' and the bottom of the gate electrode 110A$_2$. In some embodiments, the angle θ$_2$' is greater than 90 degrees. The angle θ$_2$' may be in a range from about 95 degrees to about 125 degrees. In some embodiments, the angle θ$_2$' is substantially equal to the angle θ$_1$' and smaller than the angle θ$_4$ or the angle θ$_3$ of the gate electrode 110B$_1$.

Embodiments of the disclosure have many variations. For example, the sidewall of the gate electrode is not limited to being planar. In some embodiments, the sidewall of the gate electrode is curved. By tuning the etching condition, a gate electrode having curved sidewalls can be formed. As shown in FIG. 2B, the lower portion 111L of the gate electrode 110B$_1$ has a sidewall 114'. In some embodiments, the sidewall 114' is a curved sidewall. In some embodiments, the lower portion of the gate electrode 110B$_2$ also has a curved sidewall. In some other embodiments, the sidewall of the lower portion of the gate electrode 110B$_2$ is not curved. In some other embodiments, the gate electrodes 110A$_1$ and/or 110A$_2$, which are separated from each other by a smaller distance, also have/has curved sidewalls.

Embodiments of the disclosure have many variations. The sidewalls of the recessed lower portion of the gate electrode are not limited to being slanted or curved. In some embodiments, the sidewalls of the recessed lower portion of the gate electrode are substantially vertical sidewalls. As shown in FIG. 2C, the lower portion 111L of the gate electrode 110B$_1$ has a sidewall 114". In some embodiments, the sidewall 114" is a vertical sidewall. In these cases, the angle θ$_3$' between the sidewall 114" and the bottom of the gate electrode 110B$_1$ is substantially equal to about 90 degrees. As shown in FIG. 2C, the sidewall 118b of the gate electrode 110A$_2$ is also a vertical sidewall, in accordance with some embodiments. In these cases, the angle θ$_4$' between the sidewall 118b and the bottom of the gate electrode 110A$_2$ is substantially equal to about 90 degrees.

Embodiments of the disclosure form a semiconductor device with multiple gate electrodes. By tuning the condition of the etching process for forming the gate electrodes, the bottom portions of some of the gate electrodes are recessed. Due to the gate profiles, short circuiting is significantly prevented between adjacent gate electrodes. Residue is also prevented from being formed between the adjacent gate electrodes. The quality and reliability of the semiconductor device are improved.

In an embodiment, a method includes: forming a gate dielectric layer over a semiconductor substrate; forming a gate electrode layer over the gate dielectric layer; partially removing an upper portion of the gate electrode layer by a first etching operation, the first etching operation forming recesses in the gate electrode layer; partially removing a lower portion of the gate electrode layer by a second etching operation, the second etching operation extending the recesses to form a plurality of gate electrodes from remaining portions of the gate electrode layer, the second etching operation having a different lateral etching rate for the gate electrode layer than the first etching operation; and patterning the gate dielectric layer.

In some embodiments of the method, the second etching operation includes: applying a voltage to the semiconductor substrate to adjust the lateral etching rate of the second etching operation. In some embodiments of the method, the voltage is intermittently applied to the semiconductor substrate. In some embodiments of the method, intermittently applying the voltage to the semiconductor substrate includes: applying the voltage to the semiconductor substrate; stopping application of the voltage until a protection layer forms along sidewalls of the upper portion of the gate electrode layer; and resuming application of the voltage after the protection layer forms. In some embodiments of the method, the upper portion of the gate electrode layer is protected by the protection layer during the second etching operation. In some embodiments, the method further includes: forming a dielectric layer around the gate electrodes; and replacing the gate electrodes with metal gates, the dielectric layer surrounding the metal gates. In some embodiments, the method further includes: forming a mask over the gate electrode layer, the mask having a first pitch in a first region of the semiconductor substrate, the mask having a second pitch in a second region of the semiconductor substrate, the first pitch being greater than the second pitch, the first etching operation using the mask as an etching mask. In some embodiments of the method, after the second etching operation, the gate electrodes include a first gate electrode in the first region of the semiconductor substrate and a second gate electrode in the second region of the semiconductor substrate, a lower portion of the first gate electrode having a first width, a lower portion of the second gate electrode having a second width, the first width being less than the second width. In some embodiments of the method, after the second etching operation, the gate electrodes further include a third gate electrode at a boundary of the first region and the second region of the semiconductor substrate, a lower portion of the third gate electrode having a third width, the third width being less than the second width and greater than the first width.

In an embodiment, a method includes: forming a dummy gate electrode layer over a fin; patterning the dummy gate electrode layer to form first dummy gate electrodes over a first region of the fin, and second dummy gate electrodes over a second region of the fin, the first dummy gate electrodes having a greater pitch than the second dummy gate electrodes; forming a dielectric layer around the first and second dummy gate electrodes; and replacing the first and second dummy gate electrodes with, respectively, first and second metal gate electrodes.

In some embodiments of the method, patterning the dummy gate electrode layer includes: etching an upper portion of the dummy gate electrode layer with a first etching operation; and etching a lower portion of the dummy gate electrode layer with a second etching operation, the second etching operation having different etch parameters than the first etching operation. In some embodiments of the method, the first etching operation uses one or more first etchants, the one or more first etchants including Cl$_2$, SF$_6$, N$_2$, CF$_4$, CHF$_3$, CH$_2$F$_2$, N$_2$H$_2$, O$_2$, or He. In some embodiments of the method, the second etching operation uses one or more second etchants, the one or more second etchants including Cl$_2$, BCl$_3$, N$_2$, CF$_4$, CHF$_3$, CH$_2$F$_2$, N$_2$H$_2$, or O$_2$. In some embodiments of the method, the second etching operation includes: applying a voltage to the fin; stopping application of the voltage until a protection layer forms along sidewalls of the upper portion of the dummy gate electrode layer; and resuming application of the voltage after the protection layer forms. In some embodiments of the method, the protection layer reduces an etching rate of the upper portion of the dummy gate electrode layer during the second etching operation. In some embodiments of the method, after replacing the first and second dummy gate electrodes, the first metal gate electrodes have upper widths and lower widths, and the second metal gate electrodes have upper widths and lower widths, the upper widths of the first metal gate electrodes being equal to the upper widths of the second metal gate electrodes, the lower widths of the first metal gate electrodes being less than the lower widths of the second metal gate electrodes.

In an embodiment, a method includes: forming a first dummy gate electrode over a semiconductor substrate, the first dummy gate electrode having a first sidewall forming a first angle with a first plane and a second sidewall forming the first angle with the first plane, the first plane being parallel to a major surface of the semiconductor substrate; forming a second dummy gate electrode over the semiconductor substrate, the second dummy gate electrode having a first sidewall forming a second angle with the first plane and a second sidewall forming the second angle with the first plane, the second angle being different from the first angle; forming a third dummy gate electrode over the semiconductor substrate, the third dummy gate electrode having a first sidewall forming the first angle with the first plane and a second sidewall forming the second angle with the first plane; forming a dielectric layer around the first, second, and third dummy gate electrodes; and replacing the first, second, and third dummy gate electrodes with, respectively, first, second, and third metal gate electrodes.

In some embodiments, the method further includes: forming a first gate dielectric layer contacting the major surface of the semiconductor substrate, the first sidewall of the first dummy gate electrode, and the second sidewall of the first dummy gate electrode; forming a second gate dielectric layer contacting the major surface of the semiconductor substrate, the first sidewall of the second dummy gate electrode, and the second sidewall of the second dummy gate electrode; and forming a third gate dielectric layer contacting the major surface of the semiconductor substrate, the first sidewall of the third dummy gate electrode, and the second sidewall of the third dummy gate electrode. In some embodiments of the method, forming the first, second, and third dummy gate electrodes includes: forming a dummy gate electrode layer over the semiconductor substrate; partially removing an upper portion of the dummy gate electrode layer by a first etching operation, the first etching operation forming recesses in the dummy gate electrode layer; and partially removing a lower portion of the dummy gate electrode layer by a second etching operation, the second etching operation extending the recesses to form the first, second, and third dummy gate electrodes from remaining portions of the dummy gate electrode layer, the second etching operation having different etch parameters than the first etching operation. In some embodiments of the method, the second etching operation has a different lateral etching rate for the dummy gate electrode layer than the first etching operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate dielectric layer over a semiconductor substrate;
   forming a gate electrode layer over the gate dielectric layer;
   partially removing an upper portion of the gate electrode layer by a first etching operation, the first etching operation forming recesses in the gate electrode layer;
   partially removing a lower portion of the gate electrode layer by a second etching operation, the second etching operation extending the recesses to form a plurality of gate electrodes from remaining portions of the gate electrode layer, the second etching operation having a different lateral etching rate for the gate electrode layer than the first etching operation, wherein the second etching operation comprises applying a voltage to the semiconductor substrate to adjust the lateral etching rate of the second etching operation, wherein the voltage is intermittently applied to the semiconductor substrate; and
   patterning the gate dielectric layer.

2. The method of claim 1, wherein intermittently applying the voltage to the semiconductor substrate comprises:
   applying the voltage to the semiconductor substrate;
   stopping application of the voltage until a protection layer forms along sidewalls of the upper portion of the gate electrode layer; and
   resuming application of the voltage after the protection layer forms.

3. The method of claim 2, wherein the upper portion of the gate electrode layer is protected by the protection layer during the second etching operation.

4. The method of claim 1 further comprising:
   forming a dielectric layer around the gate electrodes; and
   replacing the gate electrodes with metal gates, the dielectric layer surrounding the metal gates.

5. The method of claim 1 further comprising:
   forming a mask over the gate electrode layer, the mask having a first pitch in a first region of the semiconductor substrate, the mask having a second pitch in a second region of the semiconductor substrate, the first pitch being greater than the second pitch, the first etching operation using the mask as an etching mask.

6. The method of claim 5, wherein after the second etching operation, the gate electrodes include a first gate electrode in the first region of the semiconductor substrate and a second gate electrode in the second region of the semiconductor substrate, a lower portion of the first gate electrode having a first width, a lower portion of the second gate electrode having a second width, the first width being less than the second width.

7. The method of claim 6, wherein after the second etching operation, the gate electrodes further include a third gate electrode at a boundary of the first region and the second region of the semiconductor substrate, a lower portion of the third gate electrode having a third width, the third width being less than the second width and greater than the first width.

8. The method of claim 1, wherein the first etching operation uses one or more first etchants, the one or more first etchants comprising $Cl_2$, $SF_6$, $N_2$, $CF_4$, $CHF_3$, $CH_2F_2$, $N_2H_2$, $O_2$, or He.

9. The method of claim 8, wherein the second etching operation uses one or more second etchants, the one or more second etchants comprising $Cl_2$, $BCl_3$, $N_2$, $CF_4$, $CHF_3$, $CH_2F_2$, $N_2H_2$, or $O_2$.

10. A method comprising:
   forming a dummy gate electrode layer over a fin;
   patterning the dummy gate electrode layer to form first dummy gate electrodes over a first region of the fin, and second dummy gate electrodes over a second region of the fin, the first dummy gate electrodes having a greater pitch than the second dummy gate electrodes;
   forming a dielectric layer around the first and second dummy gate electrodes; and
   replacing the first and second dummy gate electrodes with, respectively, first and second metal gate electrodes.

11. The method of claim 10, wherein patterning the dummy gate electrode layer comprises:
   etching an upper portion of the dummy gate electrode layer with a first etching operation; and
   etching a lower portion of the dummy gate electrode layer with a second etching operation, the second etching operation having different etch parameters than the first etching operation.

12. The method of claim 11, wherein the first etching operation uses one or more first etchants, the one or more first etchants comprising $Cl_2$, $SF_6$, $N_2$, $CF_4$, $CHF_3$, $CH_2F_2$, $N_2H_2$, $O_2$, or He.

13. The method of claim 12, wherein the second etching operation uses one or more second etchants, the one or more second etchants comprising $Cl_2$, $BCl_3$, $N_2$, $CF_4$, $CHF_3$, $CH_2F_2$, $N_2H_2$, or $O_2$.

14. The method of claim 11, wherein the second etching operation comprises:
   applying a voltage to the fin;
   stopping application of the voltage until a protection layer forms along sidewalls of the upper portion of the dummy gate electrode layer; and
   resuming application of the voltage after the protection layer forms.

15. The method of claim 14, wherein the protection layer reduces an etching rate of the upper portion of the dummy gate electrode layer during the second etching operation.

16. The method of claim 10, wherein after replacing the first and second dummy gate electrodes, the first metal gate electrodes have upper widths and lower widths, and the second metal gate electrodes have upper widths and lower widths, the upper widths of the first metal gate electrodes being equal to the upper widths of the second metal gate electrodes, the lower widths of the first metal gate electrodes being less than the lower widths of the second metal gate electrodes.

17. A method comprising:
   forming a first dummy gate electrode over a semiconductor substrate, the first dummy gate electrode having a first sidewall forming a first angle with a first plane and a second sidewall forming the first angle with the first plane, the first plane being parallel to a major surface of the semiconductor substrate;
   forming a second dummy gate electrode over the semiconductor substrate, the second dummy gate electrode having a first sidewall forming a second angle with the first plane and a second sidewall forming the second angle with the first plane, the second angle being different from the first angle;
   forming a third dummy gate electrode over the semiconductor substrate, the third dummy gate electrode having a first sidewall forming the first angle with the first plane and a second sidewall forming the second angle with the first plane;
   forming a dielectric layer around the first, second, and third dummy gate electrodes; and
   replacing the first, second, and third dummy gate electrodes with, respectively, first, second, and third metal gate electrodes.

18. The method of claim 17, further comprising:
   forming a first gate dielectric layer contacting the major surface of the semiconductor substrate, a first sidewall of the first metal gate electrode, and a second sidewall of the first metal gate electrode;
   forming a second gate dielectric layer contacting the major surface of the semiconductor substrate, a first sidewall of the second metal gate electrode, and a second sidewall of the second metal gate electrode; and
   forming a third gate dielectric layer contacting the major surface of the semiconductor substrate, a first sidewall of the third metal gate electrode, and a second sidewall of the third metal gate electrode.

19. The method of claim 17, wherein forming the first, second, and third dummy gate electrodes comprises:
   forming a dummy gate electrode layer over the semiconductor substrate;
   partially removing an upper portion of the dummy gate electrode layer by a first etching operation, the first etching operation forming recesses in the dummy gate electrode layer; and
   partially removing a lower portion of the dummy gate electrode layer by a second etching operation, the second etching operation extending the recesses to form the first, second, and third dummy gate electrodes from remaining portions of the dummy gate electrode layer, the second etching operation having different etch parameters than the first etching operation.

20. The method of claim 19, wherein the second etching operation has a different lateral etching rate for the dummy gate electrode layer than the first etching operation.

* * * * *